(12) United States Patent
Furuie

(10) Patent No.: US 10,466,549 B2
(45) Date of Patent: Nov. 5, 2019

(54) DISPLAY DEVICE

(71) Applicant: Japan Display Inc., Minato-ku (JP)

(72) Inventor: Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 108 days.

(21) Appl. No.: 15/662,475

(22) Filed: Jul. 28, 2017

(65) Prior Publication Data

US 2018/0059463 A1     Mar. 1, 2018

(30) Foreign Application Priority Data

Sep. 1, 2016    (JP) ................................. 2016-171170

(51) Int. Cl.
| | | |
|---|---|---|
| G06F 3/041 | (2006.01) | |
| G02F 1/1343 | (2006.01) | |
| G02F 1/1335 | (2006.01) | |
| G02F 1/1362 | (2006.01) | |
| H01L 51/52 | (2006.01) | |

(52) U.S. Cl.
CPC .... *G02F 1/13439* (2013.01); *G02F 1/133509* (2013.01); *G02F 1/136286* (2013.01); *H01L 51/5253* (2013.01); *G02F 1/133621* (2013.01); *G02F 2201/123* (2013.01)

(58) Field of Classification Search
CPC ........... G02F 1/13439; G02F 1/133509; G02F 1/136286; G02F 2201/123; G02F 1/133621; H01L 51/5253
See application file for complete search history.

(56) References Cited

U.S. PATENT DOCUMENTS

| | | | |
|---|---|---|---|
| 2004/0185301 A1* | 9/2004 | Tsuchiya | H01L 27/127 |
| | | | 428/690 |
| 2013/0120227 A1 | 5/2013 | Tanikawa | |
| 2015/0129855 A1* | 5/2015 | Bando | H01L 51/525 |
| | | | 257/40 |
| 2018/0033834 A1* | 2/2018 | Jun | G06F 3/0412 |
| 2018/0314098 A1* | 11/2018 | Saitoh | G02F 1/1333 |

FOREIGN PATENT DOCUMENTS

JP        2013-105144        5/2013

\* cited by examiner

*Primary Examiner* — Adam R. Giesy
(74) *Attorney, Agent, or Firm* — Oblon, McClelland, Maier & Neustadt, L.L.P.

(57) ABSTRACT

A display device includes a substrate including a display area and a peripheral area outside the display area; a plurality of light emitting elements formed in the display area; a sealing layer formed in the display area and the peripheral area so as to seal the plurality of light emitting elements and having an upper surface positioned lower in the peripheral area than in the area; a spacer layer laminated on the sealing layer at least in the peripheral area to contribute to form a continuous flat surface extending from the display area to the peripheral area; and a film attached to the flat surface in the area including the display area and the peripheral area.

10 Claims, 7 Drawing Sheets

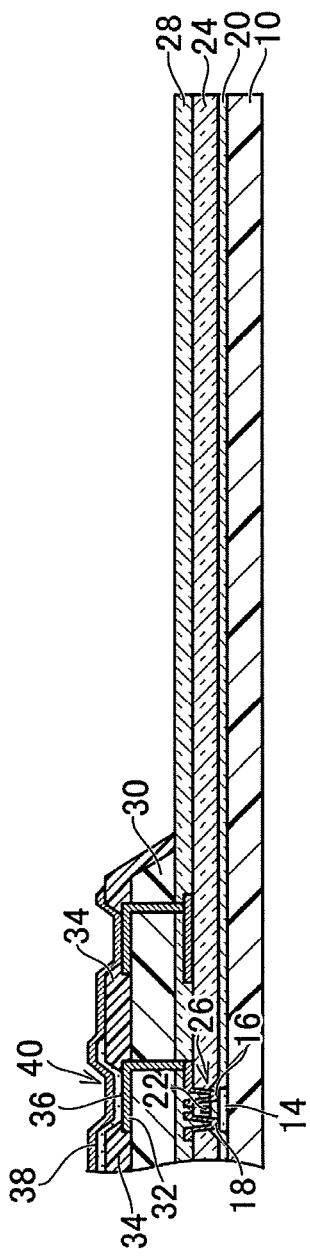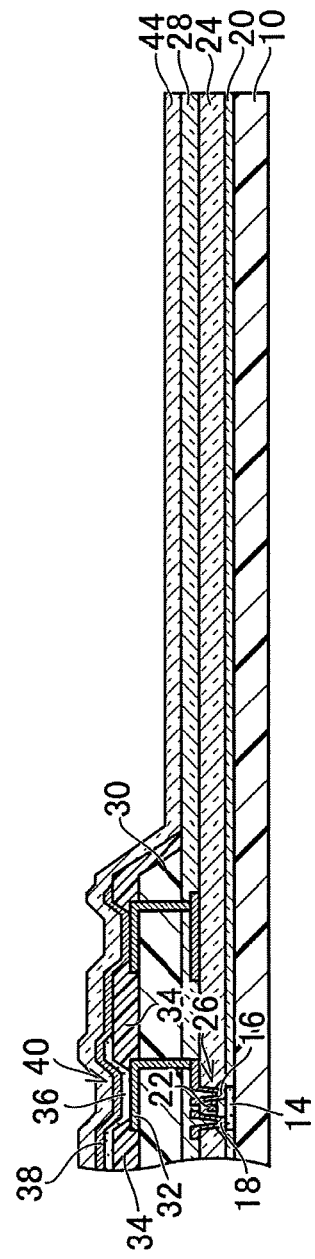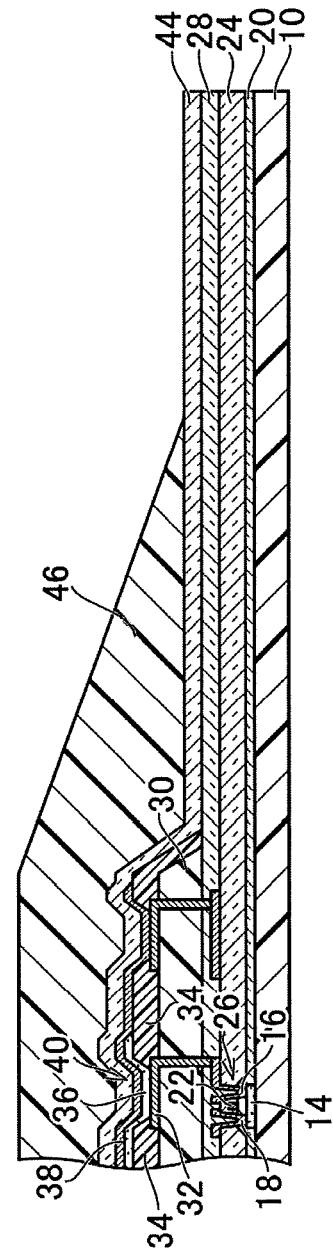

DISPLAY DEVICE

CROSS-REFERENCE TO RELATED APPLICATION

The present application claims priority from Japanese application JP2016-171170 filed on Sep. 1, 2016, the content of which is hereby incorporated by reference into this application.

BACKGROUND OF THE INVENTION

1. Field of the Invention

The present invention relates to a display device.

2. Description of the Related Art

As an organic electro-luminescence display is vulnerable to water, a display element of the organic electro-luminescence display is covered by a sealing film (Japanese Patent Laid-open Publication No. 2013-105144). A sealing film including an organic film and a pair of inorganic films each disposed on and under the organic film to thereby sandwich the organic film to improve barrier capacity has been known. The organic film is spreading from the display area to its peripheral edge. Along the peripheral edge, the organic film contacts and is overlapped by the pair of inorganic films.

An organic film is formed thick by an ink-jet method or a print method. As a result, a difference in height of the upper surface of the sealing film is resulted between the display area having the organic film and the peripheral area having no organic film. If a film, such as a polarizer plate, is attached onto the sealing film having such a difference, the film is attached in a distorted condition due to the uneven surface of the sealing film, and the film thus has a defective external appearance.

SUMMARY OF THE INVENTION

It is an object of the present invention to attach a film with good appearance.

A display device according to the present invention includes a substrate including a display area and a peripheral area outside the display area; a plurality of light emitting elements formed in the display area; a sealing layer formed in the display area and the peripheral area so as to seal the plurality of light emitting elements, and having an upper surface positioned lower in the peripheral area than in the display area; a spacer layer laminated on the sealing layer at least in the peripheral area to contribute to form a continuous flat surface extending from the display area to the peripheral area; and a film attached to the flat surface in an area including the display area and the peripheral area. According to the present invention, as the spacer layer constitutes a flat surface, it is possible to attach a film with good appearance.

BRIEF DESCRIPTION OF THE DRAWINGS

FIGS. 3A to 3C are diagrams explaining a method for manufacturing a display device according to the first embodiment of the present invention;

DETAILED DESCRIPTION OF THE INVENTION

Figure 1:
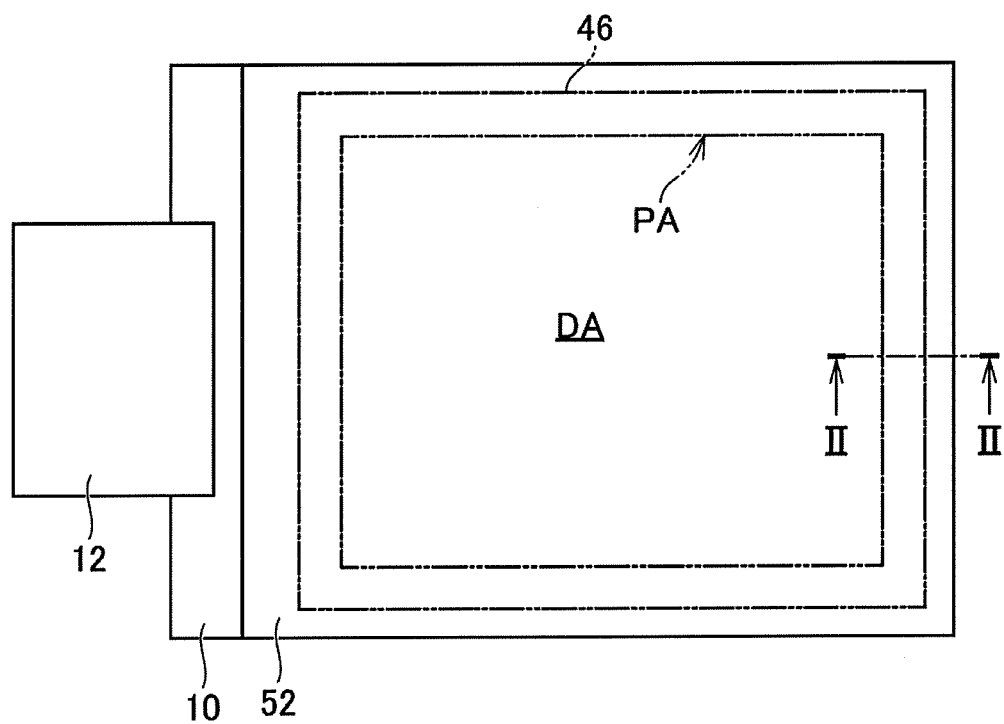
FIG. 1 is a plan view of a display device according to a first embodiment of the present invention.

The following describes an embodiment of the present invention while referring to the drawings. The present invention can be rendered into practice in various aspects without departing from the gist of the present invention, and should not be interpreted as being limited to the embodiments mentioned below as examples.

The drawings are given for clarification of the description, and the widths, thicknesses, shapes, and so forth of the respective units may be illustrated more schematically in the drawings as compared with those in actual aspects. Those illustrated in the drawings are mere examples, and should not limit interpretation of the present invention in any way. In the specification and the drawings, a component having the same function as one described earlier in connection with a figure mentioned earlier is given the same reference numeral, and a duplicate description may be avoided.

In defining a positional relationship between one component and another in the detailed description of the present invention, being "on" or "under" refers not only to being directly on or under a component but also being on or under with another component intervening, unless otherwise stated.

First Embodiment

FIG. 1 is a plan view of a display device according to a first embodiment of the present invention. As an example of a display device, an organic electro-luminescence display device is referred to. In a display device, unit pixels (sub-pixels) for a plurality of colors, such as red, green, and blue, are combined to constitute pixels in full color to display an image in full color. A display device includes a substrate 10. The substrate 10 includes a display area DA where a plurality of pixels are arranged in a matrix. The substrate 10 further includes a peripheral area PA surrounding the display area DA. The substrate 10 is connected to a flexible printed board 12 for electrical connection to outside.

Figure 2:
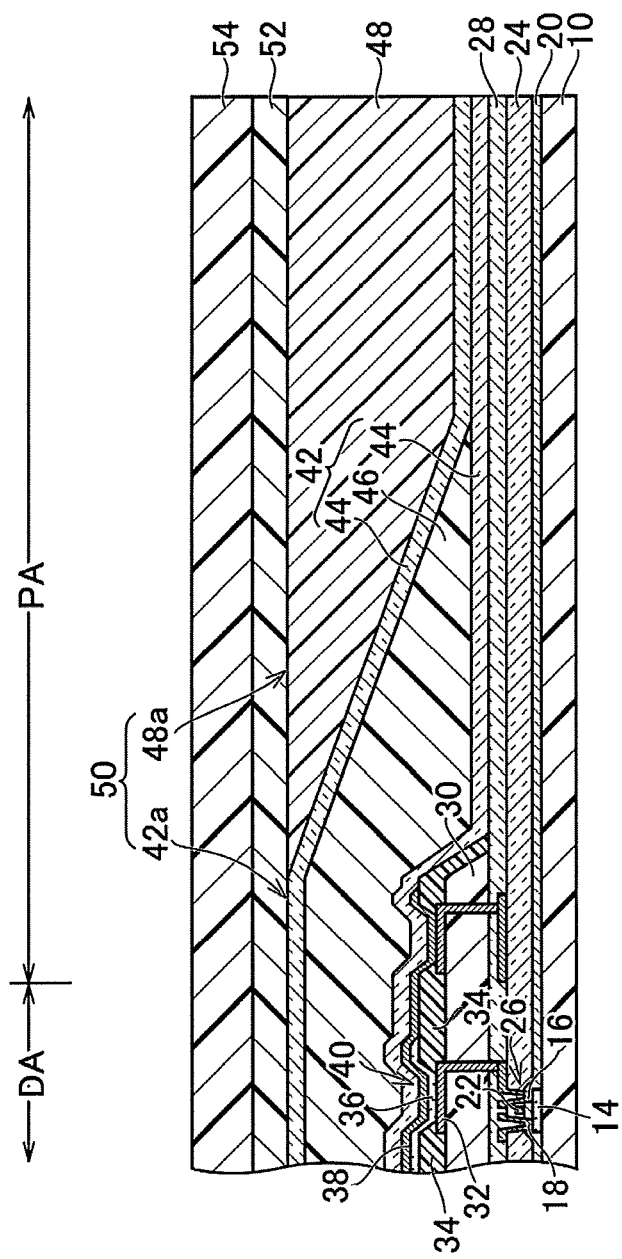
FIG. 2 is a cross sectional view of the display device illustrated in FIG. 1 along the line II-II.

FIG. 2 is a cross sectional view of the display device illustrated in FIG. 1 along the line II-II. The substrate 10 is made of resin or glass, or may be formed using a flexible film, such as polyimide or polyethylene terephthalate. Formed on the substrate 10 is an undercoat layer (not shown) that makes a barrier against impurities contained in the substrate 10. The undercoat layer is made using a silicon oxide film or a silicon nitride film, for example, or may include these layers laminated. Formed on the undercoat layer is a semiconductor layer 14, which is electrically connected to a source electrode 16 and a drain electrode 18, and is covered by a gate insulating film 20. Formed on the gate insulating film 20 is a gate electrode 22, which is covered by an interlayer insulating film 24. The source electrode 16 and the drain electrode 18 penetrate the gate insulating film 20 and the interlayer insulating film 24. The semiconductor layer 14, the source electrode 16, the drain electrode 18, and the gate electrode 22 together constitute a thin film transistor 26. The thin film transistor 26 is covered by a passivation film 28.

Formed on the passivation film 28 is a planarization layer 30. A plurality of pixel electrodes 32 (for example, a positive electrode) corresponding to a plurality of respective unit pixels (sub-pixels) are formed on the planarization layer 30. At least a surface of the planarization layer 30 where the pixel electrode 32 is formed is flat. The planarization layer 30 is often made of organic material such as photosensitivity acrylic resin. The pixel electrode 32 is electrically connected to either one of the source electrode 16 and the drain electrode 18 on the semiconductor layer 14 through a contact hole penetrating the planarization layer 30 and the passivation film 28.

Formed on the planarization layer 30 and the pixel electrode 32 is an insulating layer 34. The insulating layer 34 is disposed on the peripheral portion of the pixel electrode 32 so as to expose a part (for example, the middle part) of the pixel electrode 32. The insulating layer 34 forms a bank surrounding the part of the pixel electrode 32.

Formed on the pixel electrode 32 is a light emitting layer 36. The light emitting layer 36 is formed separately (apart) for every pixel electrode 32, and disposed also on the insulating layer 34. In this case, the light emitting layer 36 emits light in blue, red, or green, corresponding to each pixel. The color for each pixel, however, is not limited to those mentioned above, and may be yellow or white, for example. Alternatively, the light emitting layer 36 may cover the entire display area DA (see FIG. 1). That is, the light emitting layer 36 may be formed continuous on the insulating layer 34. The light emitting layer 36, when formed covering the plurality of pixels, emits light in white for all sub-pixels, so that a part of a wavelength for a desired color is extracted through a filter (not shown).

Formed on the light emitting layer 36 is an opposed electrode 38 (a common electrode or a negative electrode). The opposed electrode 38 is disposed on the insulating layer 34 constituting a bank. A light emitting element 40 that contains the light emitting layer 36 and the pixel electrode 32 and the opposed electrode 38 together sandwiching the light emitting layer 36 is formed. Each of the plurality of pixels has the light emitting element 40. A plurality of light emitting elements 40 are formed in the display area DA. The light emitting layer 36 is disposed between the pixel electrode 32 and the opposed electrode 38. The brightness of the light emitting layer 36 is controlled by a current flowing across the pixel electrode 32 and the opposed electrode 38, and the light emitting layer 36 emits light. At least one of a hole transport layer and a hole injection layer (both not shown) may be formed between the light emitting layer 36 and the pixel electrode 32. At least one of an electron transport layer and an electron injection layer may be formed between the light emitting layer 36 and the opposed electrode 38.

The plurality of light emitting elements 40 are shielded by a sealing layer 42 to be thereby shut off from water. The sealing layer 42 spreads from the display area DA to the peripheral area PA. The sealing layer 42 includes an organic film 46 and a pair of inorganic films 44 sandwiching the organic film 46. The organic film 46 is made of acrylic resin or epoxy resin, for example, and covers foreign matters or the like to thereby increase shielding capability. The pair of inorganic films 44 are each disposed on and under the organic film 46 so as to sandwich the organic film 46, and contact each other around the organic film 46. The organic film 46 is formed continuous in the display area DA and the peripheral area PA, and has a thickness of a few to ten or more μm in the display area DA. The thickness of the organic film 46 becomes gradually thinner toward the end of the organic film 46 in the peripheral area PA. With this gradual thinning, the upper surface 42a of the sealing layer 42 is positioned lower in the peripheral area PA than in the display area DA. That is, the upper surface 42a is inclined outward in the peripheral area PA.

In at least the peripheral area PA, a spacer layer 48 is formed on the sealing layer 42. In this embodiment, the spacer layer 48 is not formed in the display area DA. The spacer layer 48 may be made of black material and then modified, or made of conductive material to shut off static electricity from outside. The presence of the spacer layer 48 contributes to continuous formation of a planarization surface 50 spreading from the display area DA to the peripheral area PA. The planarization surface 50 includes the upper surface 42a of the sealing layer 42 and the upper surface 48a of the spacer layer 48. The peripheral edge of the substrate 10 coincides with that of the spacer layer 48.

In the area including the display area DA and the peripheral area PA, a film 54 is attached to the planarization surface 50 via an adhesive layer 52. The adhesive layer 52 continuously intervenes between the film 54 and the planarization surface 50 in the area including the display area DA and the peripheral area PA. The peripheral edge of the spacer layer 48 coincides with that of the film 54. According to this embodiment, as the spacer layer 48 constitutes the planarization surface 50, the film 54 can be attached with good appearance.

FIGS. 3A to 4B explain a method for manufacturing a display device according to the first embodiment of the present invention.

In this embodiment, as illustrated in FIG. 3A, the thin film transistor 26 and the light emitting element 40 are formed on the substrate 10. The light emitting layer 36, when formed separately for every pixel electrode 32, is formed through deposition. Meanwhile, the light emitting layer 36, when formed covering all the plurality of pixels over the entire display area DA (see FIG. 1), is formed through coating through solvent dispersion.

As illustrated in FIG. 3B, the inorganic film 44 is formed so as to cover the light emitting element 40 through chemical vapor deposition, using $SiH_4$ or $NH_3$, for example. Subsequently, as illustrated in FIG. 3C, the organic film 46 is formed using ultraviolet curable or thermocurable acrylic resin or epoxy resin. When the viscosity of the material is a few mPs·s, an ink-jet method is employed. Meanwhile, when the viscosity is a few hundreds of mPs·s, a printing method (screen printing or intaglio printing) is employed. The organic film 46 is formed having a thickness of a few to dozens of μm in the display area DA. The thickness of the organic film 46 becomes gradually thinner toward outside as the end portion flows in the peripheral area PA.

Figure 4A:
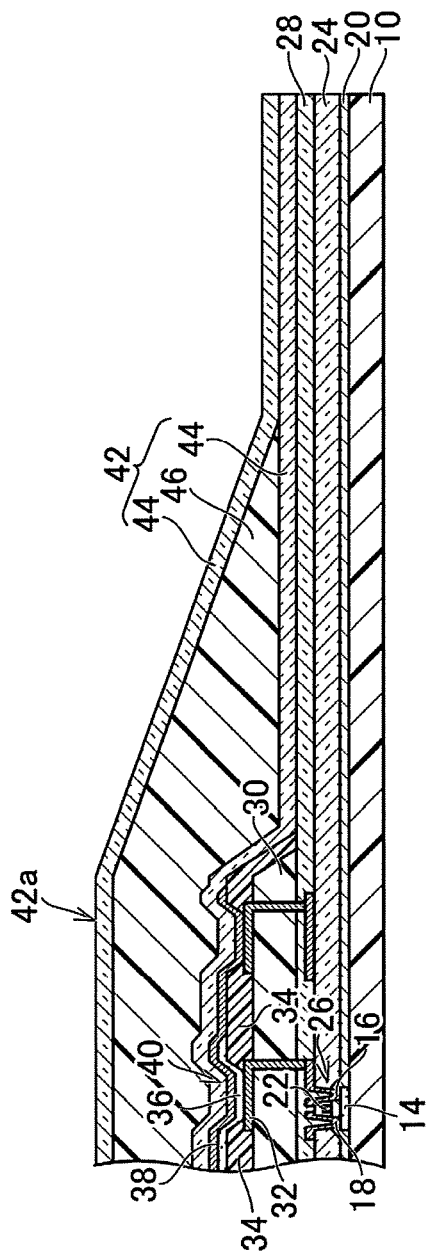
FIGS. 4A to 4B are diagram explaining a method for manufacturing a display device according to a first embodiment of the present invention.
Figure 4B:
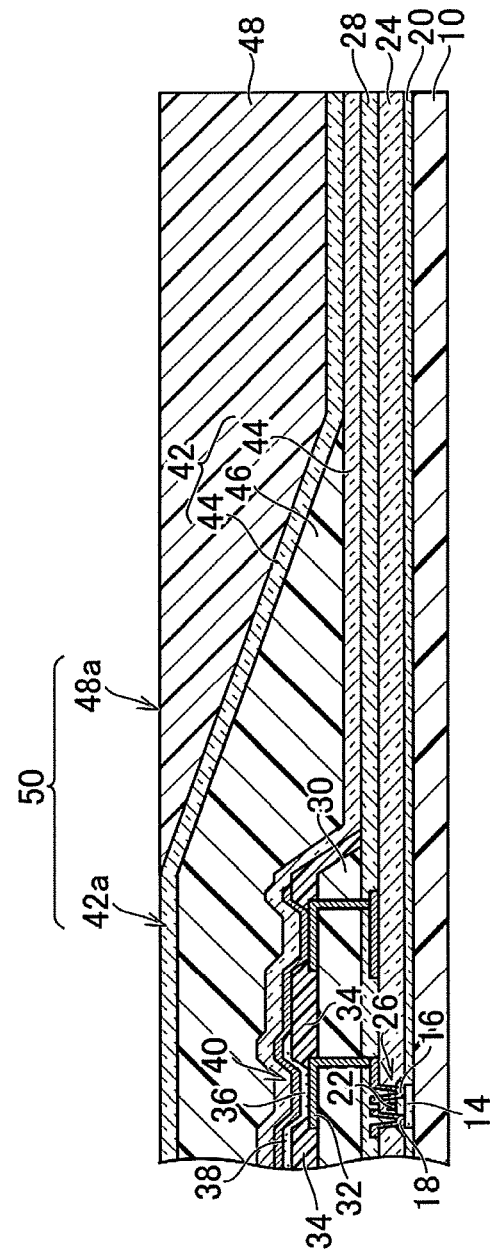

As illustrated in FIG. 4A, the inorganic film 44 is formed on the organic film 46 through chemical vapor deposition, using $SiH_4$ or $NH_3$, for example. As illustrated in FIG. 4B, the spacer layer 48 is formed on the sealing film, using resin such as photo-resist material, through photolithography or direct imaging method. As illustrated in FIG. 2, the film 54 is thereafter attached via the adhesive layer 52 to the upper surface of the sealing film and that of the spacer layer 48, both constituting the planarization surface 50.

Second Embodiment

Figure 5:
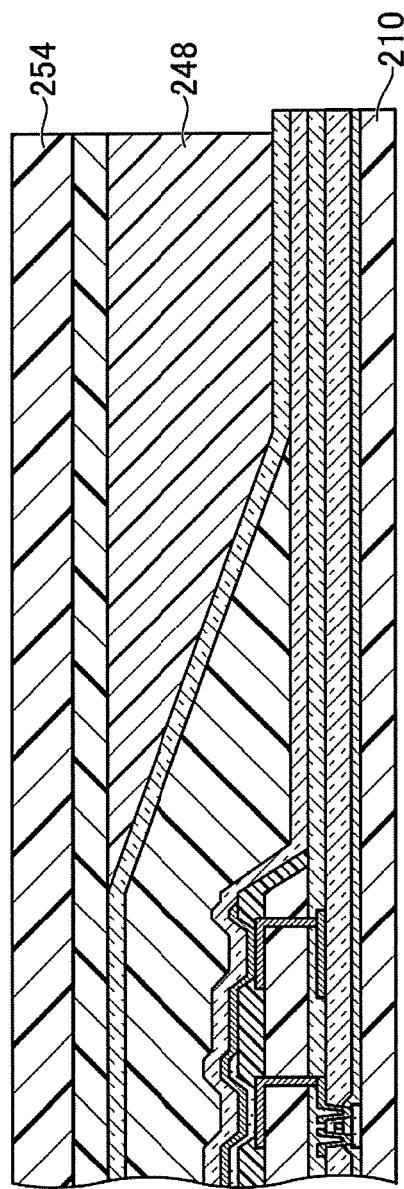
FIG. 5 is a cross sectional view of a display device according to a second embodiment of the present invention.

FIG. 5 is a cross sectional view of a display device according to a second embodiment of the present invention.

In this embodiment, the peripheral edge of a substrate 210 sticks out from the peripheral edge of a spacer layer 248. The peripheral edge of the spacer layer 248 coincides with that of a film 254.

In multiple formation, if employed, in a manufacturing process, the spacer layer 248 is formed with a margin in the case where the substrate 210 is disconnected before formation of the spacer layer 248 so that the spacer layer 248 does not stick out from the substrate 210. Through manufacturing in this manner, the structure of this embodiment is implemented. Meanwhile, when a mother substrate is disconnected together with the spacer layer in multiple formation, the peripheral edge of the substrate coincides with that of the spacer layer. Through manufacturing in this manner, the structure described in the first embodiment is implemented.

Third Embodiment

Figure 6:
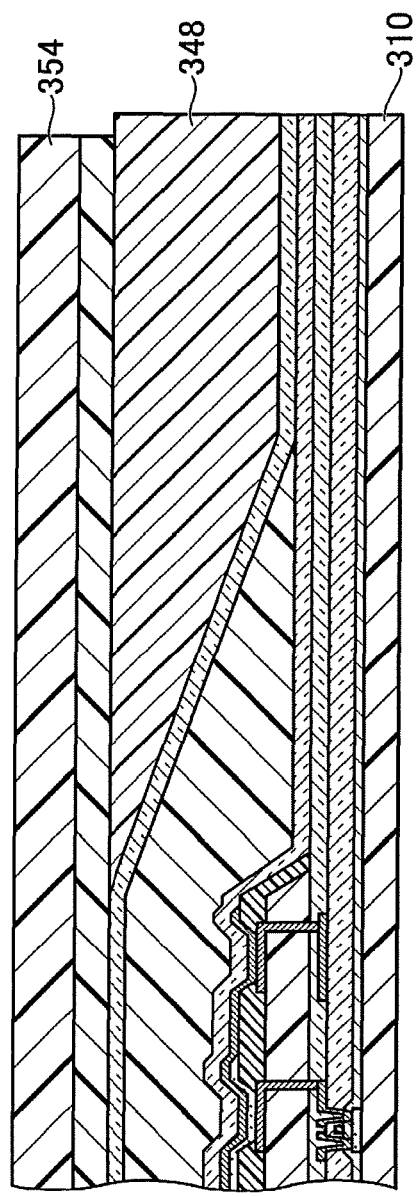
FIG. 6 is a cross sectional view of a display device according to a third embodiment of the present invention.

FIG. 6 is a cross sectional view of a display device according to a third embodiment of the present invention. In this embodiment, the peripheral edge of a spacer layer 348 sticks out from the peripheral edge of a film 354. The peripheral edge of a substrate 310 coincides with that of the spacer layer 348.

Fourth Embodiment

Figure 7:
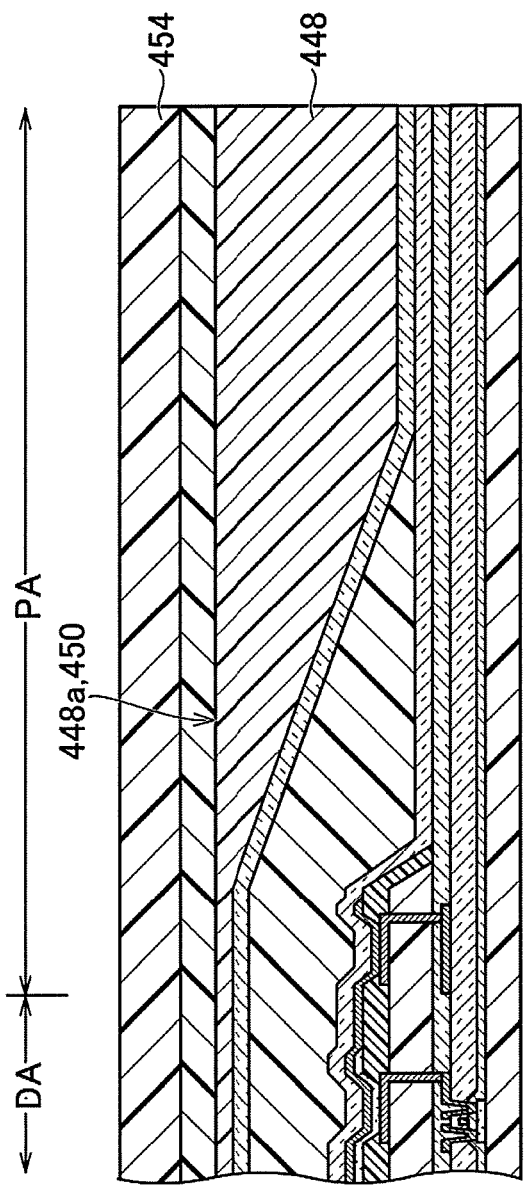
FIG. 7 is a cross sectional view of a display device according to a fourth embodiment of the present invention.

FIG. 7 is a cross sectional view of a display device according to a fourth embodiment of the present invention. In this embodiment, the spacer layer 448 is formed continuous in the display area DA and the peripheral area PA. A planarization surface 450, on which a film 454 is attached, is the upper surface of the spacer layer 448.

Note that the display device is not limited to an organic electro-luminescence display device, and may be a display device, such as a quantum-dot light emitting diode (QLED), having a light emitting element for each pixel, or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
   a substrate including a display area and a peripheral area outside the display area;
   a plurality of light emitting elements formed in the display area;
   a sealing layer formed in the display area and the peripheral area so as to seal the plurality of light emitting elements, and having an upper surface positioned lower in the peripheral area than in the display area;
   a spacer layer laminated on the sealing layer at least in the peripheral area to contribute to form a continuous flat surface extending from the display area to the peripheral area; and
   a film attached to the flat surface in an area including the display area and the peripheral area,
   wherein the sealing layer includes an organic film and a pair of inorganic films, the organic film continuously formed in the display area and the peripheral area and having a thickness that becomes gradually thinner toward an end of the organic film in the peripheral area, the pair of inorganic films each disposed on and under the organic film so as to together sandwich the organic film and contacting each other around a periphery of the organic film.

2. The display device according to claim 1, wherein
   the spacer layer is formed avoiding the display area, and
   the flat surface includes the upper surface of the sealing layer and an upper surface of the spacer layer.

3. The display device according to claim 1, wherein
   the spacer layer is formed continuous in the display area and the peripheral area, and
   the flat surface is an upper surface of the spacer layer.

4. The display device according to claim 1, further comprising an adhesive layer continuously intervening between the film and the flat surface in an area including the display area and the peripheral area.

5. The display device according to claim 1, wherein a peripheral edge of the spacer layer coincides with a peripheral edge of the film.

6. The display device according to claim 5, wherein a peripheral edge of the substrate coincides with the peripheral edge of the spacer layer.

7. The display device according to claim 5, wherein a peripheral edge of the substrate sticks out from the peripheral edge of the spacer layer.

8. The display device according to claim 1, wherein a peripheral edge of the spacer layer sticks out from a peripheral edge of the film.

9. The display device according to claim 1, wherein the spacer layer is made of black material.

10. The display device according to claim 1, wherein the spacer layer is made of conductive material.

* * * * *